(12) United States Patent
Shuey et al.

(10) Patent No.: US 9,448,264 B2
(45) Date of Patent: Sep. 20, 2016

(54) USING LOAD-SIDE VOLTAGE AND AN AUXILIARY SWITCH TO CONFIRM THE CLOSE OR OPEN STATUS OF A METER DISCONNECT SWITCH

(71) Applicant: ELSTER SOLUTIONS, LLC, Raleigh, NC (US)

(72) Inventors: Kenneth C. Shuey, Zebulon, NC (US); Garry M. Loy, Raleigh, NC (US)

(73) Assignee: Elster Solutions, LLC, Raleigh, NC (US)

( * ) Notice: Subject to any disclaimer, the term of this patent is extended or adjusted under 35 U.S.C. 154(b) by 135 days.

(21) Appl. No.: 14/193,909

(22) Filed: Feb. 28, 2014

(65) Prior Publication Data

US 2015/0247900 A1 Sep. 3, 2015

(51) Int. Cl.
*G01R 7/00* (2006.01)
*G01R 22/06* (2006.01)
*G01R 31/327* (2006.01)

(52) U.S. Cl.
CPC ......... *G01R 22/065* (2013.01); *G01R 31/3277* (2013.01)

(58) Field of Classification Search
None
See application file for complete search history.

(56) References Cited

U.S. PATENT DOCUMENTS

| 4,999,730 | A | 3/1991 | Pickard |
| 5,488,565 | A * | 1/1996 | Kennon ............... G01R 22/066 307/132 EA |
| 5,940,009 | A | 8/1999 | Loy et al. |
| 7,046,031 | B2 | 5/2006 | Magerl et al. |
| 7,224,287 | B2 | 5/2007 | Heider et al. |
| 7,362,003 | B2 * | 4/2008 | Stewart ............... F03B 13/1845 290/42 |
| 7,746,054 | B2 | 6/2010 | Shuey |
| 7,772,812 | B2 | 8/2010 | Shuey |
| 7,772,829 | B2 | 8/2010 | Shuey |
| 2008/0204953 | A1 * | 8/2008 | Shuey ..................... G01R 11/25 361/60 |
| 2009/0167547 | A1 | 7/2009 | Gilbert |
| 2012/0078546 | A1 | 3/2012 | Mancuso et al. |
| 2012/0245869 | A1 * | 9/2012 | Ansari ................ G01R 22/066 702/62 |
| 2013/0278245 | A1 | 10/2013 | Loy et al. |

* cited by examiner

*Primary Examiner* — Minh N Tang
(74) *Attorney, Agent, or Firm* — Baker & Hostetler LLP

(57) ABSTRACT

The invention relates to a method and system for secure confirmation of the status of a metering disconnect switch. By utilizing both a mechanical auxiliary switch and the reading of a load-side voltage immediately after a switch operation, a nearly certain decision can be achieved that the state of the relay is accurately known. This invention will prevent a motorized or solenoid driven switch operator from achieving a close or open state of the switch that otherwise could be uncertain.

14 Claims, 14 Drawing Sheets

USING LOAD-SIDE VOLTAGE AND AN AUXILIARY SWITCH TO CONFIRM THE CLOSE OR OPEN STATUS OF A METER DISCONNECT SWITCH

TECHNICAL FIELD

The present invention relates generally to electricity metering systems, and, more particularly, to an apparatus and method for determining the open or close status of a meter disconnect switch.

BACKGROUND

For residential metering systems, more and more utilities today are using electronic metering devices. Electronic meters are cost effective and provide the utility with measurements of a number of electrical parameters. A function that many electronic metering devices provide is the ability to include whole house meter disconnect switches. These switches offer a utility the ability to disconnect power from the residence without visiting the site. This remote operational capability saves money and reduces manpower. For example, a utility may need to disconnect service when a subscriber moves out of a particular location and then later reconnect service to the same location when another subscriber moves in. Likewise, utility companies are sometimes forced to disconnect service to a subscriber who does not pay, and then reconnect service when the subscriber's account is settled. A number of electronic metering devices currently exist that provide connect/disconnect capability through the use of disconnect switches internal to the meter.

When a metering disconnect switch is operated by a motorized driver, there is some uncertainty regarding the total travel of the switch, since the motor's travel is dependent on the applied voltage and the time the voltage is applied. For different temperature and load conditions, the motor may travel faster or slower.

One technique for determining the position of a meter disconnect switch is load-side voltage sensing. After a command to disconnect power is issued to a meter disconnect switch, the meter may use a sensor to determine whether load-side voltage is still present. When the disconnect switch is properly open, there should be no load-side voltage detected. If load-side voltage is detected after a command to disconnect power has been issued to the disconnect switch, an error condition may be reported.

SUMMARY

This invention relates to an electrical energy meter for metering electrical energy which is delivered from a voltage source, via feeder lines, to an electrical load at a subscriber location. The meter is disposed between the voltage source and the electrical load. The meter comprises a disconnect switch, a load-side voltage sensor, a position sensor, and a processor. The disconnect switch is interposed into the feeder lines, and switches between an open position, in which electrical energy is not supplied to the electrical load, and a closed position, in which electrical energy is supplied to the electrical load. The load-side voltage sensor provides voltage signals indicative of load-side voltage on a side of the disconnect switch connected to the electrical load. The position sensor is operably coupled to the disconnect switch and provides an indication of whether the disconnect switch is in the open or closed position. The processor receives the voltage signals from the load-side voltage sensor indicative of load-side voltage, and the indication of the disconnect switch position from the position sensor, and determines therefrom whether an abnormal condition exists.

BRIEF DESCRIPTION OF THE DRAWINGS

The foregoing summary, as well as the following detailed description of illustrative embodiments of the present application, will be better understood when read in conjunction with the appended drawings. For the purposes of illustrating the present application, there is shown in the drawings illustrative embodiments of the disclosure. It should be understood, however, that the application is not limited to the precise arrangements and instrumentalities shown. In the drawings.

DETAILED DESCRIPTION OF ILLUSTRATIVE EMBODIMENTS

The invention now will be described more fully hereinafter with reference to the accompanying drawings, in which various exemplary embodiments are shown illustrating variations within the scope of the invention. This disclosure may, however, be embodied in many different forms and should not be construed as limited to the embodiments set forth herein; rather, these embodiments are provided so that this disclosure will be thorough and complete, and will fully convey the scope of the disclosure to those of ordinary skill in the art.

Figure 1:
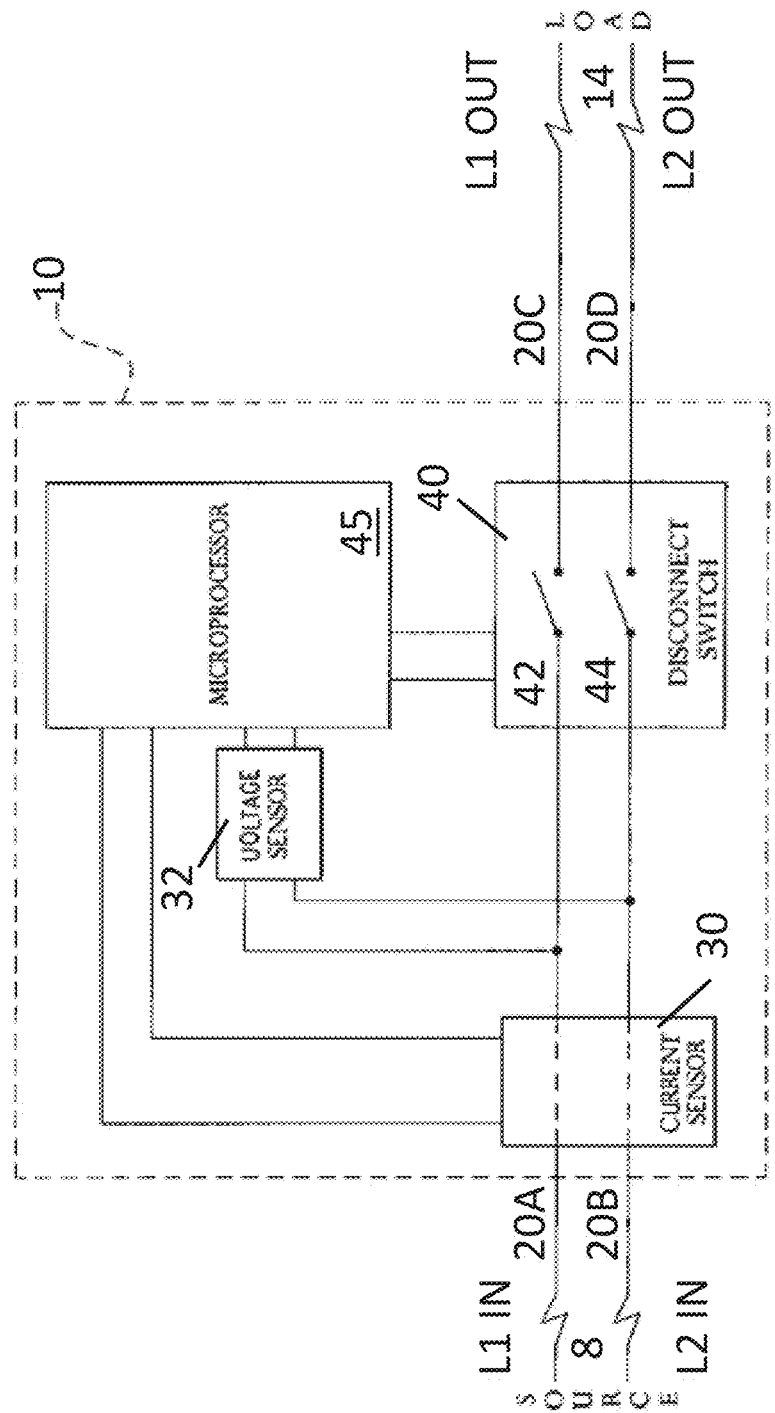
FIG. 1 is a schematic of an electrical energy meter with an internal disconnect switch.

FIG. 1 illustrates an exemplary electricity meter 10 that is interposed into electricity feeder lines 20. In particular, the meter 10 connects to the source-side of the feeder lines at contacts 20A and 20B and to the load-side at contacts 20C and 20D. The meter measures the consumption of electrical energy by the load 14 (e.g., appliances, etc.). As further shown, the meter 10 comprises a current sensor 30 for measuring current flow in the feeder lines, and a voltage sensor 32 for measuring voltage on the lines. A microprocessor 45 obtains samples of the current and voltage measurements and calculates therefrom a measure of energy consumption in accordance with known methods. The microprocessor also controls other internal functions of the meter. As still further shown, the meter also includes a disconnect switch 40 which, in this example, is controlled by the microprocessor 45. The disconnect switch 40 includes two electrical switches 42 and 44—one for each of the feeder lines. When the switches 42 and 44 are in an open position (as shown), the electricity supplied by the source 8 is disconnected from the load 14. When the switches are closed, electricity flows from source 8 to load 14 and the meter operates normally.

Figure 2:
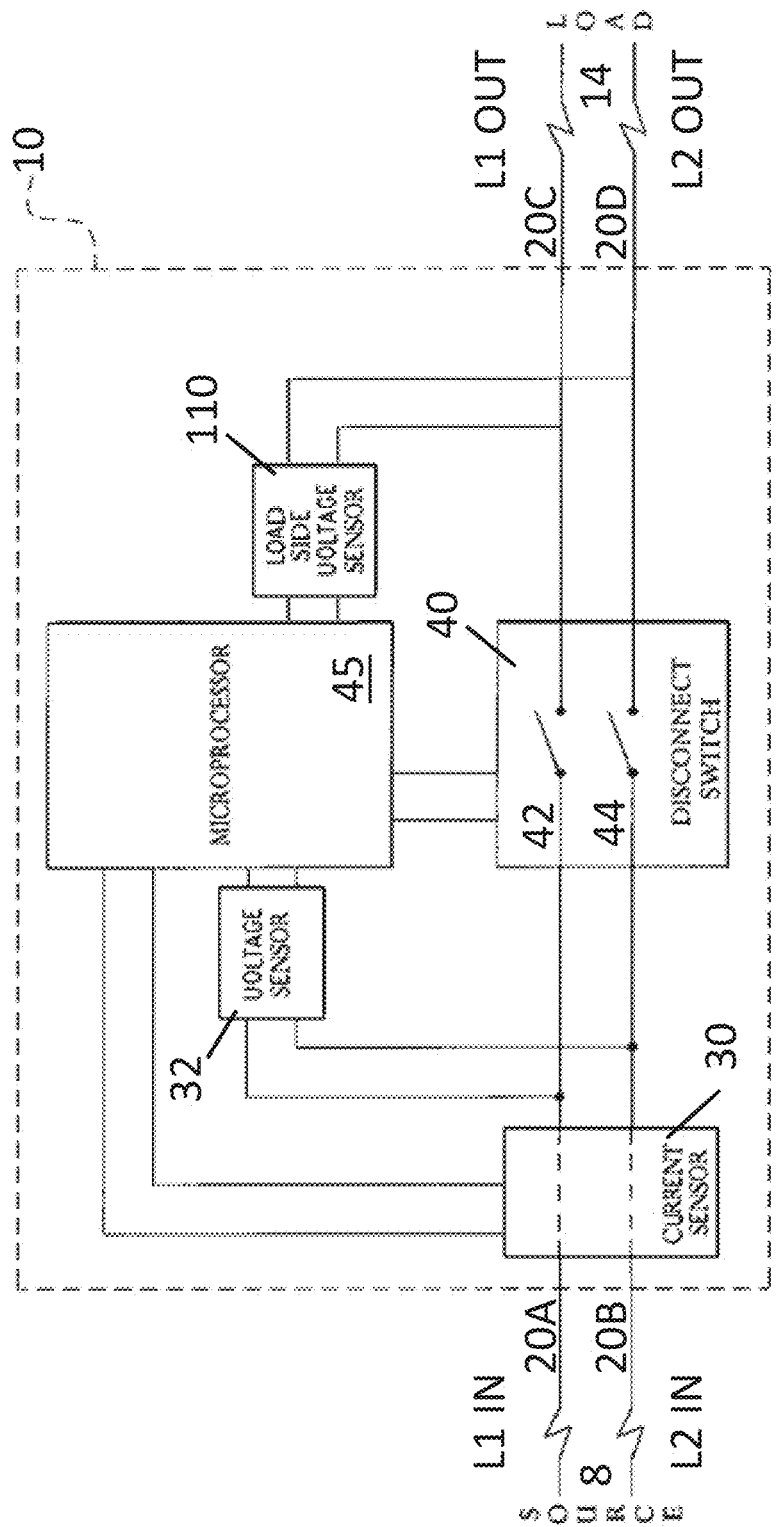
FIG. 2 is a schematic of an electrical energy meter with a load-side voltage sensor.

FIG. 2 illustrates another embodiment of meter 10 in which the meter further includes a load-side voltage sensor 110. The load-side voltage sensor 110 is connected to load-side feeder lines 20C and 20D on the load-side of disconnect switch 40 and provides voltage signals to microprocessor 45. Specifically, the load-side voltage sensor 110 may provide a voltage signal that is indicative of load-side voltage. The microprocessor 45 accepts voltage signals from load-side voltage sensor 110 and determines whether a load-side voltage is present. If a load-side voltage is present, then electrical energy is being supplied to the subscriber location 14. If no load-side voltage is present, then electrical energy is not being supplied to the subscriber location 14.

Figure 3:
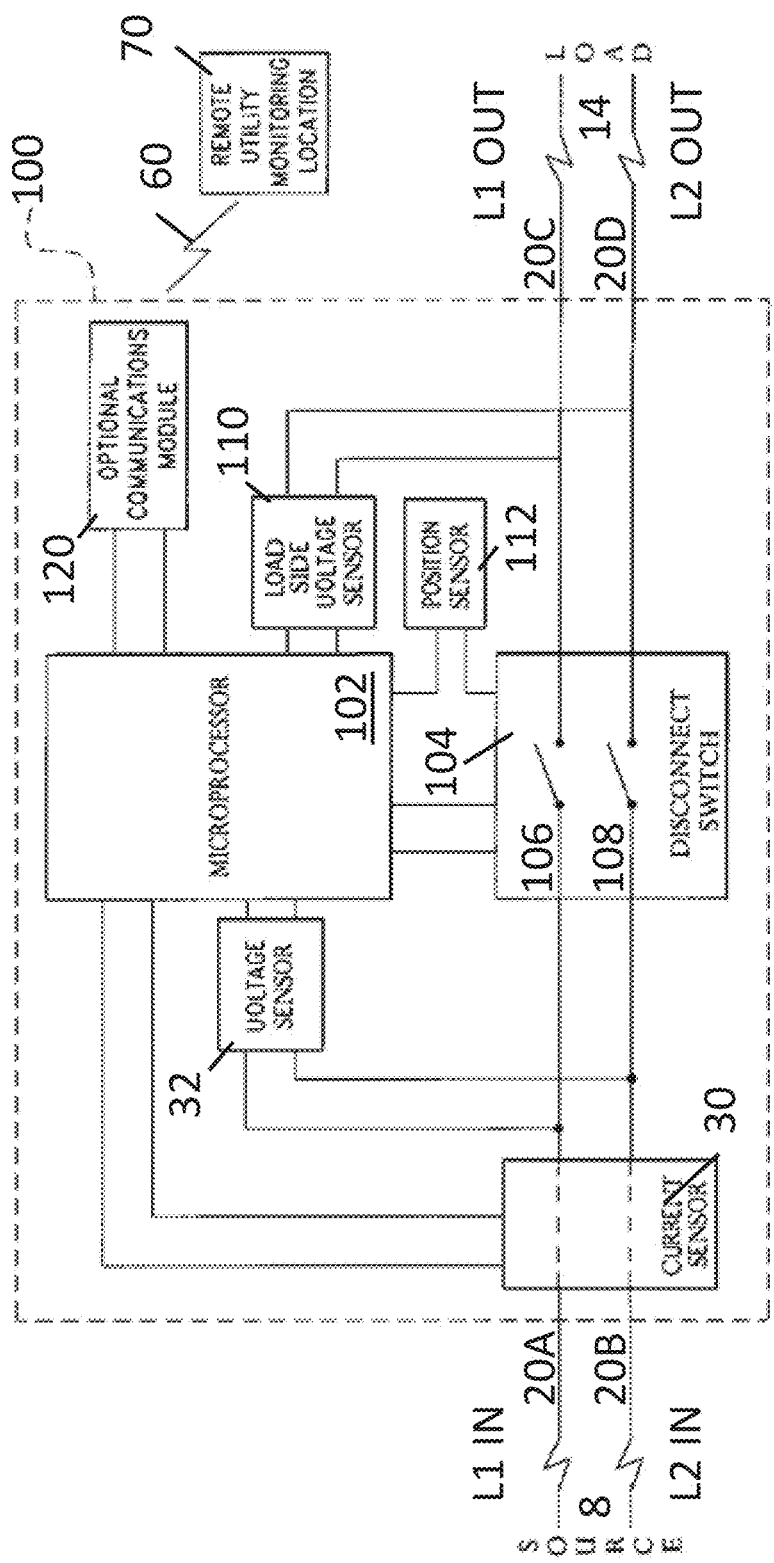
FIG. 3 is a schematic of an electrical energy meter with a load-side voltage sensor and a position sensor, in accordance with one embodiment disclosed herein.

FIG. 3 is a schematic of an electrical energy meter 100 in accordance with one embodiment disclosed herein. As in the case of the meter 10 shown in FIGS. 1 and 2, the meter 100 is disposed between an electrical energy source 8 and an electrical load 14, and it meters electrical energy delivered from source 8 to the load 14 via feeder lines 20 at a subscriber location. As further shown, the meter 100 comprises a disconnect switch 104, interposed into the feeder lines 20, for switching between an open position in which electrical energy is not supplied to the electrical load 14 and a closed position in which electrical energy is supplied to the electrical load. The meter 100 further comprises a load-side voltage sensor 110, which provides voltage signals indicative of load-side voltage on a side of the disconnect switch 104 connected to the electrical load 14. In addition, the meter 100 comprises a position sensor 112 operably coupled to the disconnect switch 104 and providing an indication whether the disconnect switch is in the open or closed position. The meter 100 also comprises a processor 102, such as a microprocessor, that receives the voltage signals from the load-side voltage sensor 110 indicative of load-side voltage and the indication of the position of the disconnect switch 104 from the position sensor 112 and determines therefrom whether an abnormal condition exists. As shown, the meter 100 may further comprise a current sensor 30, a source-side voltage sensor 32, and an optional communications module 120.

In greater detail, electrical energy (at meter inputs "L1 IN" and "L2 IN") is supplied by the source 8 and delivered, via source side feeder lines 20A and 20B, through meter 100, to the electrical load at the subscriber location 14 (via meter outputs "L1 OUT" and "L2 OUT"). Disconnect switch or electrical relay 104 is interposed onto the feeder lines, effectively separating the feeder lines into source side feeder lines 20A and 20B, and load-side feeder lines 20C and 20D. As shown, in this embodiment, the disconnect switch or relay 104 comprises two switches 106,108—one for each feeder line. When disconnect switch 104 is closed, electrical energy should be supplied to subscriber location 14, and when disconnect switch 104 is open, no electrical energy should be supplied to subscriber location 14. In one embodiment, the switches 106,108 may be driven by a motor. In another embodiment, switches 106,108 may be solenoid driven electromechanical switches.

The load-side voltage sensor 110 is connected to load-side feeder lines 20C and 20D on the load-side of disconnect switch 104 and provides voltage signals to microprocessor 102. Specifically, the load-side voltage sensor 110 may provide a voltage signal that is indicative of load-side voltage. The microprocessor 102 accepts voltage signals from load-side voltage sensor 110 and determines whether a load-side voltage is present. Load-side voltage sensing is utilized as a safety measure to prevent closure into portable generation equipment and is also one method of detecting tampering of the meter disconnect switch 104. If load-side voltage is detected when the switch is in the open position, it is best to prevent the switch from being closed and causing damage or potential fire. An open switch, load-side voltage condition, should be flagged immediately.

In an embodiment, a criterion for sensing load-side voltage is that the voltage preferably is sensed almost immediately after the switch operation (seconds rather than minutes). The microprocessor 102 may sample the voltage signal from the load-side voltage sensor 110 within one second of a meter disconnect operation (i.e., a command to open the meter disconnect switch). If delays are present between the switch operation and the sensing of load-side voltage, there may be a potential for false readings of switch status due to customer interactions.

It should be noted that the microprocessor 102 provides conventional metering functions in addition to abnormal condition detection, such as metering electrical energy consumption and other electrical parameters based on source side current and voltage signals provided by source side current sensor 30 and voltage sensor 32, respectively. In another embodiment, more than one microprocessor may be used: a first, an analog-to-digital converter/digital signal processor (A/D-DSP) used for metering functions; and a second, a microcontroller, used for control functions.

Continuing with FIG. 3, a position sensor 112 is operably connected to the meter disconnect switch 104 and to the microprocessor 102. The position sensor 112 may provide a means for determining the position status of the disconnect switch 104. For instance, when a disconnect switch 104 is operated by a motorized driver, there may be uncertainty regarding the total travel of the mechanism since the motor's travel is dependent on the applied voltage and the time the voltage is applied. Therefore, the position sensor 112 may determine whether the disconnect switch 104 was in fact operated to the desired state, either opened or closed. An indication of whether the disconnect switch 104 is open or closed could then be provided to the microprocessor 102.

A utility may send a command to the meter to open or close the disconnect switch 104. In response to the command, the microprocessor 102 will operate (e.g., energize or de-energize) the disconnect switch 104 to open or close it as commanded. In addition to the information provided by the position sensor 112 and the load-side voltage sensor 110, the microprocessor 102 may also retain in its internal memory an indicator of whether the disconnect switch 104 has been operated to be opened or closed. That is, the indicator indicates the expected position of disconnect switch. In an embodiment, the indicator is a single bit—set high, for example, if the switch should be open; set low if the switch should be closed. Thus, if the indicator bit is set high, the utility has disconnected disconnect switch 104 and no load-side voltage should be present. On the other hand, if the indicator bit is set low, disconnect switch 104 is connected and a load-side voltage should be present. Therefore, the microprocessor 102 may determine whether an abnormal condition exists and, more specifically, whether the condition is a true tamper condition or whether the meter is operating improperly based on (1) the indicator of whether the position sensor should be open or closed; (2) a voltage signal indicative of load-side voltage from the load-side voltage sensor 110; and (3) a signal indicative of the position of the switch 104 from the position sensor 112.

In an embodiment, the different conditions of the meter 100 may be flagged as either a tamper condition or a failure of the meter to operate properly. If a customer has bypassed the disconnect switch 104 of the meter 100, that could be flagged as a tamper condition. Further, if the meter is broken or not functioning properly, that could also be identified accordingly. The following examples illustrate how the microprocessor 112 may determine whether an abnormal condition may exist and what type of condition:

EXAMPLE 1.

In a situation where the microprocessor 102 has retained in its memory an indication that the disconnect switch 104 should be in the open position, the position sensor 112 provides a signal indicating the disconnect switch 104 is in the open position, and the load-side voltage sensor 110 provides a voltage signal indicating that there is no load-side voltage, then the microprocessor determines that no abnormal condition exists. An abnormal condition is determined not to exist because all the indicators are consistent. This is also true when information retained in memory of the microprocessor 102 indicates the switch 104 is closed, the position sensor 112 indicates the disconnect switch 104 is closed, and the load-side voltage sensor 110 indicates that there is load-side voltage. As before, all the indicators are consistent; therefore, an abnormal condition is determined not to exist.

EXAMPLE 2.

In a situation where the microprocessor 102 has retained in its memory an indication that the disconnect switch 104 should be in the open position, the position sensor 112 provides a signal indicating the disconnect switch is in the closed position, and the load-side voltage sensor 110 provides a voltage signal indicating that there is a load-side voltage, then the microprocessor determines that an abnormal condition exists. All the indicators are not consistent. While the position sensor 112 and the load-side voltage sensor 110 are consistent, the indication retained in the microprocessor 102 is inconsistent. Because the position sensor 112 and the load-side voltage sensor 110 are consistent, this may be a situation in which the meter is not operating correctly, as opposed to a tamper condition. The meter may be functioning improperly because the memory of the microprocessor 102 regarding the position of the switch 104 is inconsistent with the actual position of the disconnect switch 104 as indicated by the position sensor 112. This result would also hold true if the load-side voltage sensor 110 and the position sensor 112 indicated, respectively, that there is no voltage on the load-side and the disconnect switch 104 is open, and that the memory of the microprocessor 102 indicated that the disconnect switch 104 should be closed.

EXAMPLE 3.

In a situation where the microprocessor 102 has retained in its memory an indication that the disconnect switch 104 should be in the closed position, the position sensor 112 provides a signal indicating the disconnect switch 104 is in the open position, and the load-side voltage sensor 110 provides a voltage signal indicating that there is a load-side voltage, then the microprocessor indicates that an abnormal condition exists. Since the indication retained in memory and the indication from the position sensor 112 are inconsistent, the meter may not be functioning properly. Additionally, since the position sensor 112 and the load-side voltage sensor 110 are not consistent, there may also be a tamper situation.

EXAMPLE 4.

In a situation where the microprocessor 102 has retained in its memory an indication that the disconnect switch 104 should be in the open position, the position sensor 112 provides a signal indicating the disconnect switch 104 is in the open position, and the load-side voltage sensor 110 provides a voltage signal indicating that there is a load-side voltage, then the microprocessor determines that an abnormal condition exists. When the position sensor 112 indicates disconnect switch 104 is open, there should be no electrical energy at the load-side 14. Since there is a voltage signal indicating that a load-side voltage exists, then this may be a tamper situation.

Continuing with FIG. 3, in one embodiment, the meter 100 does not include the optional communications module 120. In this embodiment, if an abnormal condition is detected, the microprocessor 102 may store an indicator that an abnormal condition exists along with the type of condition and the date and time of the detection. When a meter technician comes on site to read the meter 100, the technician may read the indicator. If the technician learns that there is an abnormal condition, he can notify the utility.

In another embodiment, the meter 100 does include an optional communications module 120 for communicating with a remote utility monitoring location 60. Optional communications module 120 may be a two-way communications interface to the remote utility monitoring location 60 and may include any communications interface, such as a radiofrequency (RF) transceiver, or an interface to the telephone lines or power lines at the subscriber location 14, etc. Optional communication module 120 may communicate with remote utility monitoring location 60 via communications link 70. Communications link 70 might be a private or public network.

When the optional communications module 120 is included, if an abnormal condition is detected, the microprocessor 102 may store an indicator that an abnormal condition exists along with the type of condition and the date and time of the detection. A utility may then issue a read command from the remote utility monitoring location 60 to the meter 100. In response, meter 100 may transmit its meter data. In addition to transmitting the usage data normally transmitted in response to such read commands, the meter 100 may also transmit the indicator stored in microprocessor 102 indicating whether an abnormal condition has been detected. In response to receiving such an indicator, the utility can act accordingly.

In another embodiment, the microprocessor 102 may initiate transmission of a message through communications module 120 to the remote utility monitoring location 60 when an abnormal condition is detected. The message may indicate the type of condition and the date and time the detection occurred, and any other information the utility may desire that is computed by or stored in the microprocessor 102. In response, the utility can investigate the situation and, if an abnormal condition does exist, the utility can correct the condition.

In an embodiment in which a meter 100 is equipped with a communications module 120, the utility can also send a command to the microprocessor to activate the disconnect switch 104 to connect or disconnect the supply of electrical energy to a subscriber location from a remote location (e.g., from a master station). For example, if disconnect switch 104 is open and the utility wishes to restore service to the subscriber location 14, the utility may issue a connect command across the two-way communications path from the master station to the meter 100. The connect command is received by communications module 120 and delivered to microprocessor 102. In response, microprocessor 102 operates the drive mechanism (e.g., motor or solenoid) to drive the switches 106,108 in the direction necessary to close. Similarly, the utility may disconnect service remotely by issuing a disconnect command from the master station across the two-way communications path from the master station to the meter 100. The disconnect command is received by communications module 120 and delivered to microprocessor 102. In response, microprocessor 102 operates the drive mechanism for the disconnect switch to drive the switches 106,108 in the direction necessary to open. Thus, the utility can easily and cost effectively connect/disconnect service to a subscriber location without the need to send a human to the site.

Figure 4:
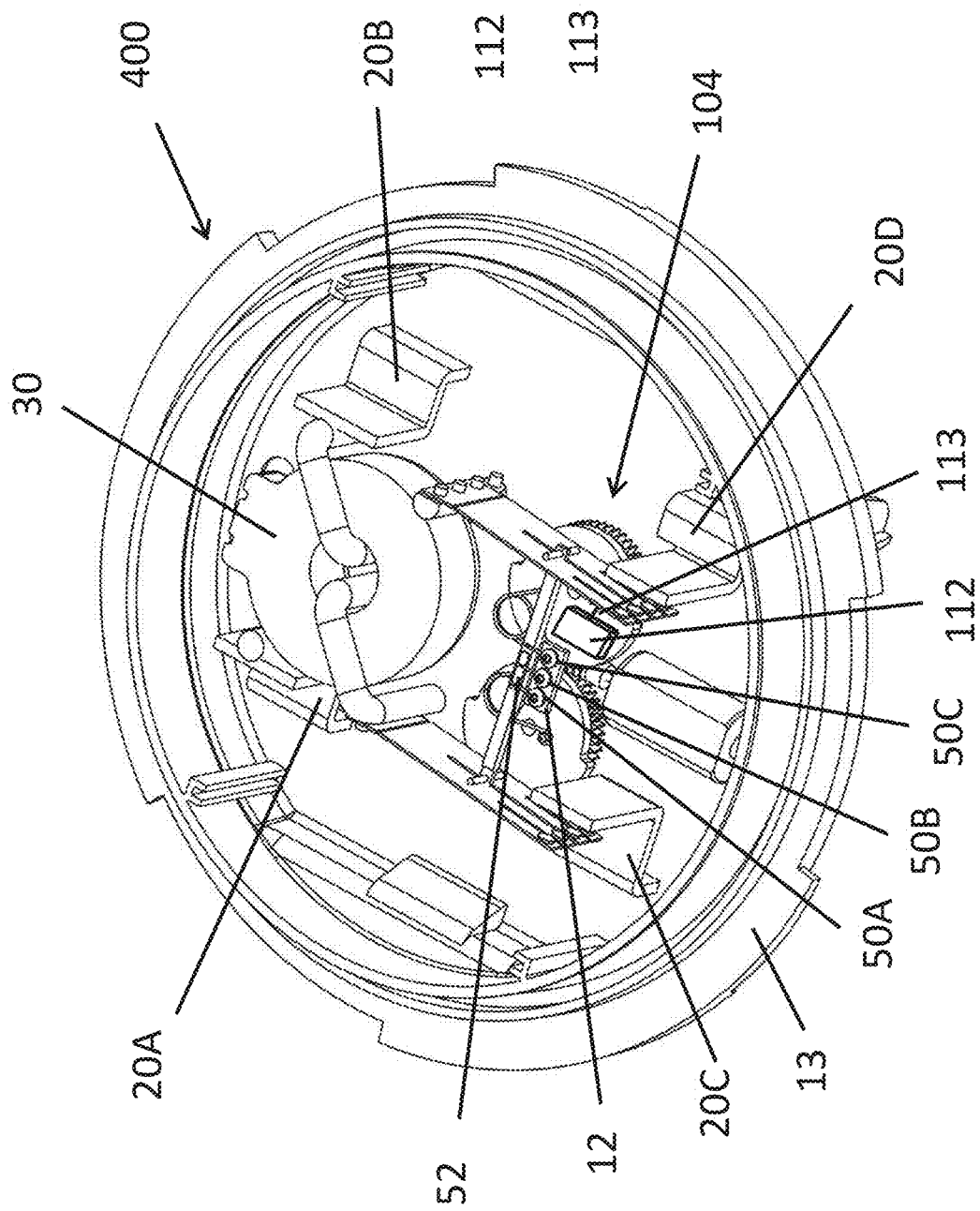
FIG. 4 is a perspective view of an exemplary embodiment of a base of an electrical energy meter with its cover (not shown) removed.
Figure 5A:
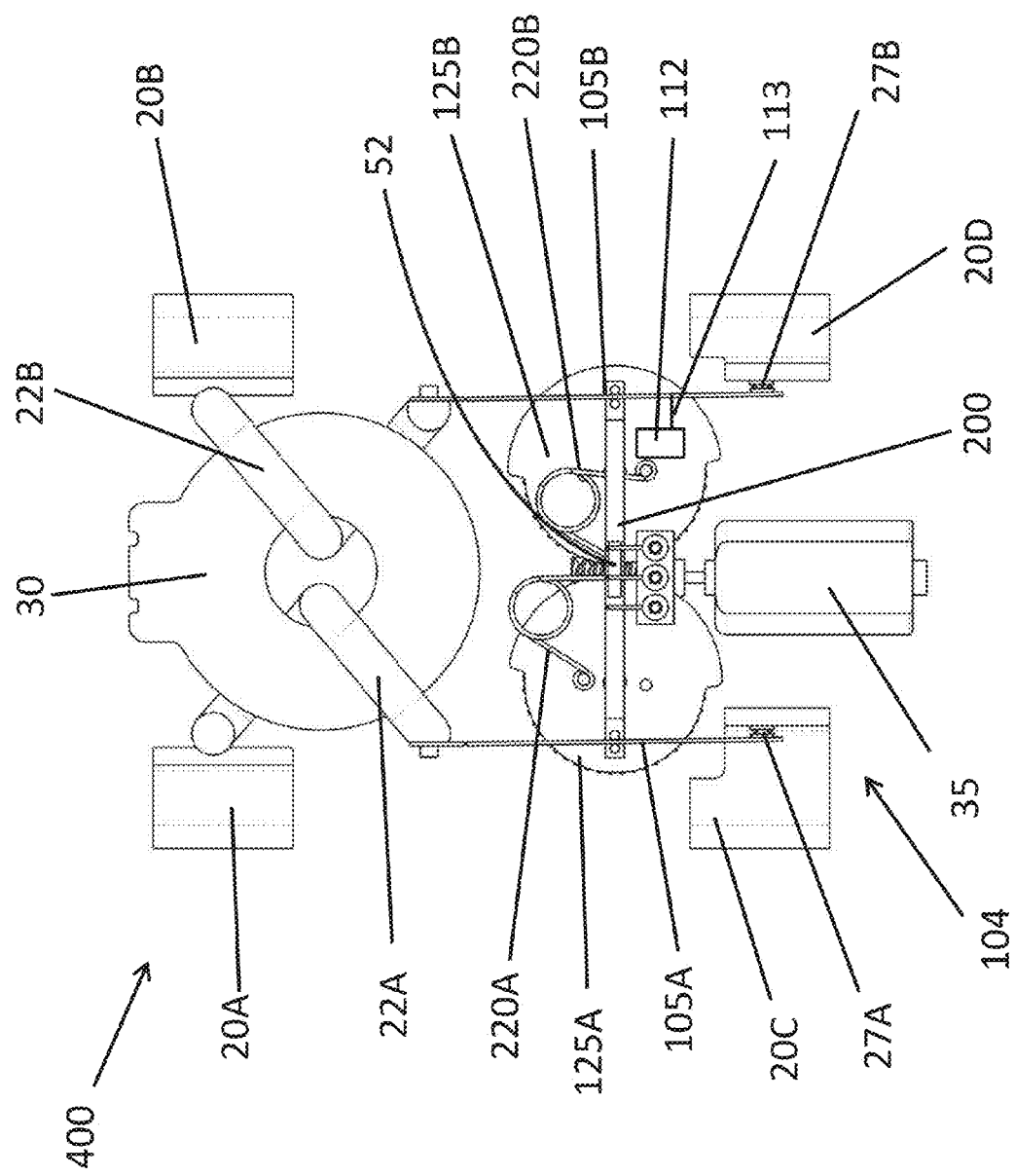
FIG. 5a is a top planar view of the embodiment of the electrical energy meter shown in FIG. 4 with a switch in the closed position and with portions cut away.

FIG. 4 is a perspective view of one embodiment of an electrical energy meter 400, such as a single phase watt hour meter, which includes the capabilities described above and illustrated schematically in FIG. 3. In the embodiment shown, the meter 400 comprises a single current sensor 30, line terminals 20A,B and load terminals 20C,D, position sensor 112, motor 35, and a disconnect switch 104. Note that the load-side voltage sensor is not illustrated in this figure. The current sensor 30 may be configured to measure the flow of current through the meter 400 when the switch 104 is closed so as to permit current flow. Specifically, as shown in FIG. 5a, line terminal 20A is attached to a conductor 22A which enables the flow of current through the bore (not shown) of the current sensor 30. Similarly, line terminal 20B is attached to a conductor 22B which enables the flow of current through the bore (not shown) of the current sensor 30. The disconnect switch 104 may comprise a control switch 12, metal electrodes 50A,B,C, fixed insulated base 11, cams 125A,B, contact arms 105A,B, and springs 220A,B. The motor 35 may move the disconnect switch 104 to and from the open and closed positions. The position sensor 112 may be configured to determine the position of the disconnect switch 104 and provide the microprocessor 102 with an indication of whether the switch 104 is in the open or closed position.

Figure 5B:
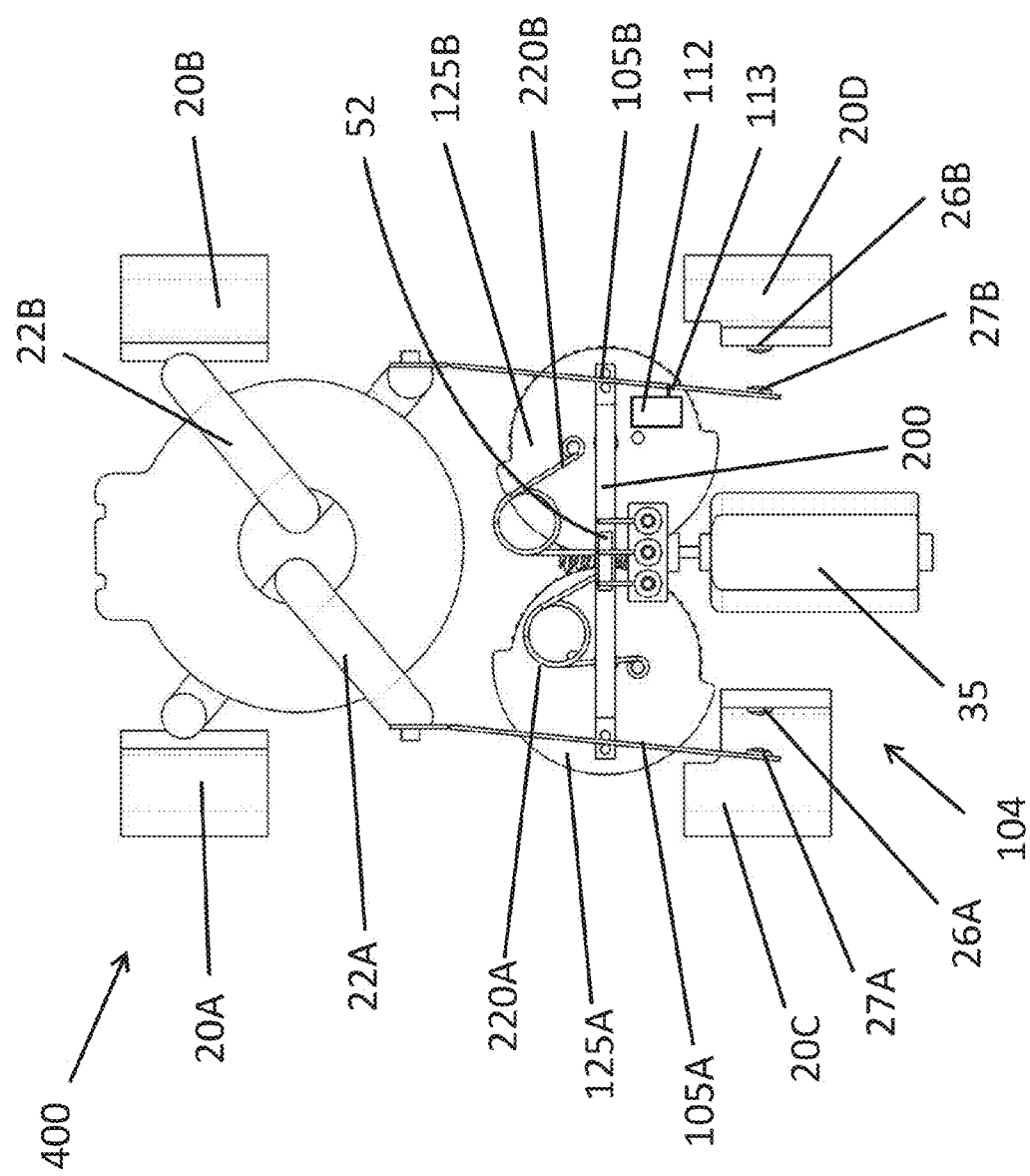
FIG. 5b is a top planar view of the embodiment of the electrical energy meter shown in FIG. 4 with the switch in the open position and with portions cut away.

FIGS. 5a and 5b illustrate a top planar view of the embodiment of the electrical energy meter 400 shown in FIG. 4 (with portions cut away) with the disconnect switch 104 in the closed position and open position, respectively. Conductors 22A,B may each be attached to contact arms 105A,B, respectively of the disconnect switch 104. The contact arms 105A,B may conduct the flow of electrical current to movable switch contacts 27A,B which may be mounted on fingers 108A,B of the contact arms 105A,B, respectively. The movable switch contacts 27A,B may be configured to align with corresponding fixed switch contacts 26A,B. In the closed position (FIG. 5a), contact arms 105A,B may be oriented so that the movable switch contacts 27A,B are positioned to touch the fixed switch contacts 26A,B of the load-side terminals 20C,D, respectively—thus allowing current to flow. In the opened position (FIG. 5b), the contact arms 105A,B may be oriented so that they are positioned far enough apart from the load-side terminals 20C,D that current does not flow or arc between the contacts and the load-side terminals 20C,D. In an alternative embodiment, one or more pairs of contacts 26A,B, 27A,B may be used.

Referring to FIGS. 4, 5a, and 5b, in an embodiment, a control switch 12 may be used to operate a motor 35. The control switch 12 may include the three spring type conductive metal electrodes 50A,B,C mounted on a fixed insulated base 11, with electrodes 50A,C connected to a control system (not shown) and electrode 50B connected to the motor 35. In one embodiment, the fixed insulated base 11 may be part of the meter housing 13. In one embodiment, the center electrode 50B is wired to the motor 35 such that the center electrode 50B is configured to be energized by conductive plate 52. At the time the meter receives a command to change the switch configuration, or open or closed state, the control system will energize either electrode 50A or 50C, which will indirectly energize the motor through the conductive plate 52 and electrode 50B. When the relay state changes, the connection to the energized electrode is broken and the motor 35 stops. The control system is configured to energize electrode 50A to close the contacts, and energize 50C to open the contacts. For example, as shown in FIG. 5a, the contacts are closed, so to open the contacts, the control system would energize 50C. If 50A were energized, there would be no effect because 50A is not in contact with the conductive plate 52. In an embodiment, the conductive plate 52 is attached to the linearly actuating member 200, which corresponds to the positions of the contact arms 105A,B. Referring to FIG. 5a, in order to open the disconnect switch 104, the control system energizes electrode 50C, which in turn energizes the conductive plate 52 which energizes the center electrode 50B, which is connected to the motor 35, causing the motor 35 to run. As the motor 35 runs, mechanical energy is stored in the springs 220A,B, and the springs will cause the linear actuating member 200 to shift when the cams 125A,B allow. When the linear actuating member 200 shifts, opening the contacts, the conductive plate 52 is no longer energized through electrode 50C, causing the motor 35 to stop. The motor 35 and springs 220A,B work in conjunction to shift the linearly actuating member 200 (and the conductive plate 52) from right to left. As described above, when the linearly actuating member 200 shifts, it also shifts the contact arms 105A,B moving them to either the closed or opened position.

In the embodiment illustrated in FIGS. 4, 5a, and 5b, the position sensor 112 is mounted onto the electrical energy meter 400 and operably coupled to the disconnect switch 104. As illustrated, in this embodiment, the position sensor 112 is a microswitch with an extension arm 113. The extension arm 113 may be in contact with either contact arm 105A,B, such that, when a contact arm 105A,B moves, the extension arm 113 moves. In other embodiments, the extension arm 113 may be in contact with the linear actuating member 200, for example. As the motor 35 runs, causing the linear actuating member 200 to move right or left and the contact arms 105A,B to open or close, the extension arm 113 activates the microswitch. The activation/deactivation of the microswitch thus provides an indication of the disconnect switch 104 position to the microprocessor 102.

The remaining figures, 6a through 9b, illustrate different embodiments of an electrical energy meter in which the position sensor takes different forms. While there are a limited number of embodiments described, these specific embodiments are not intended to limit the scope of the disclosure as otherwise described and claimed herein. Modifications and variations from these embodiments exist. More specifically, the following examples are given as a specific illustration of embodiments of the claimed disclosure. It should be understood that the invention is not limited to the specific details set forth in the examples.

Figure 6A:
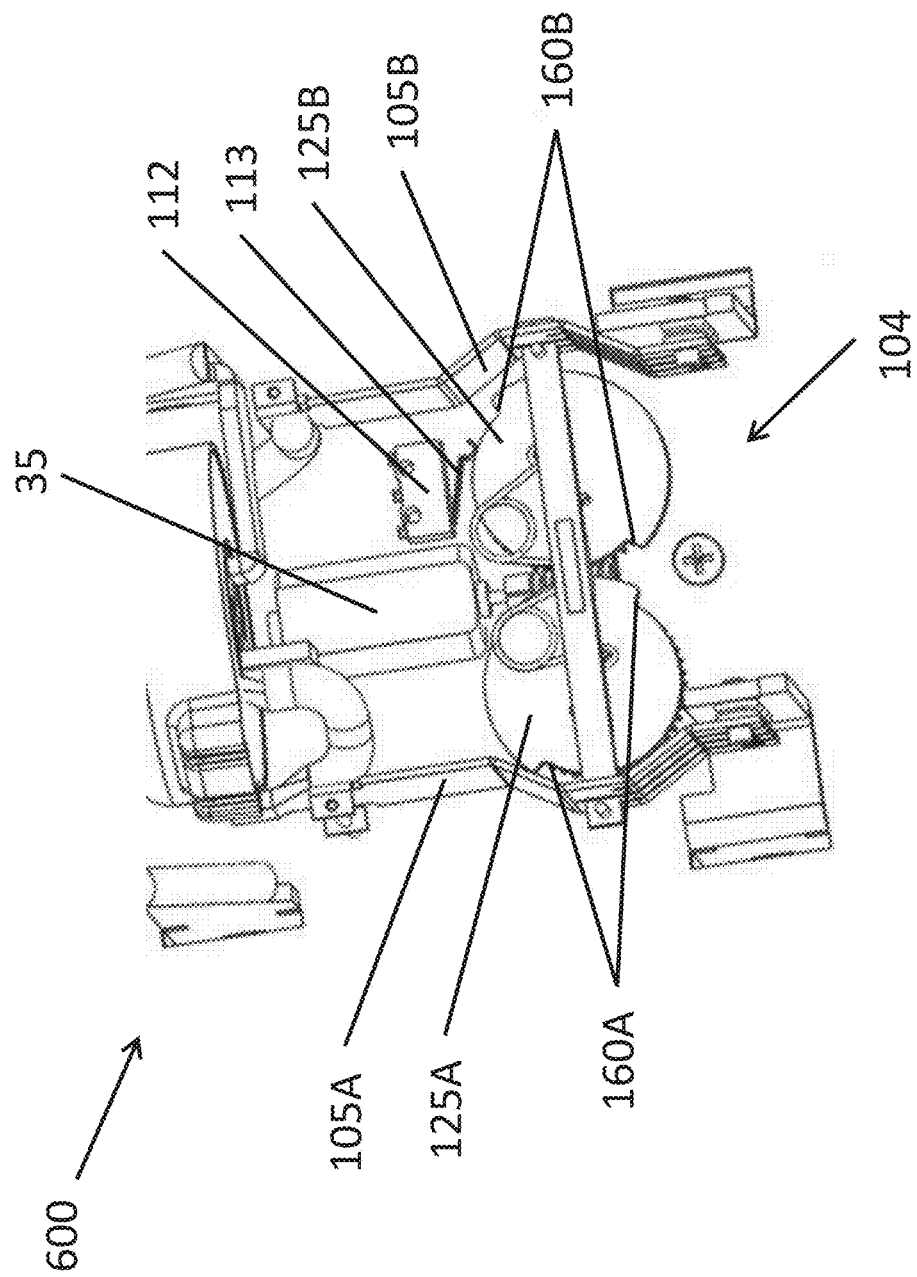
FIG. 6a is a perspective view of another exemplary embodiment of an electrical energy meter with a main switch cam and a switch in the closed position.
Figure 6B:
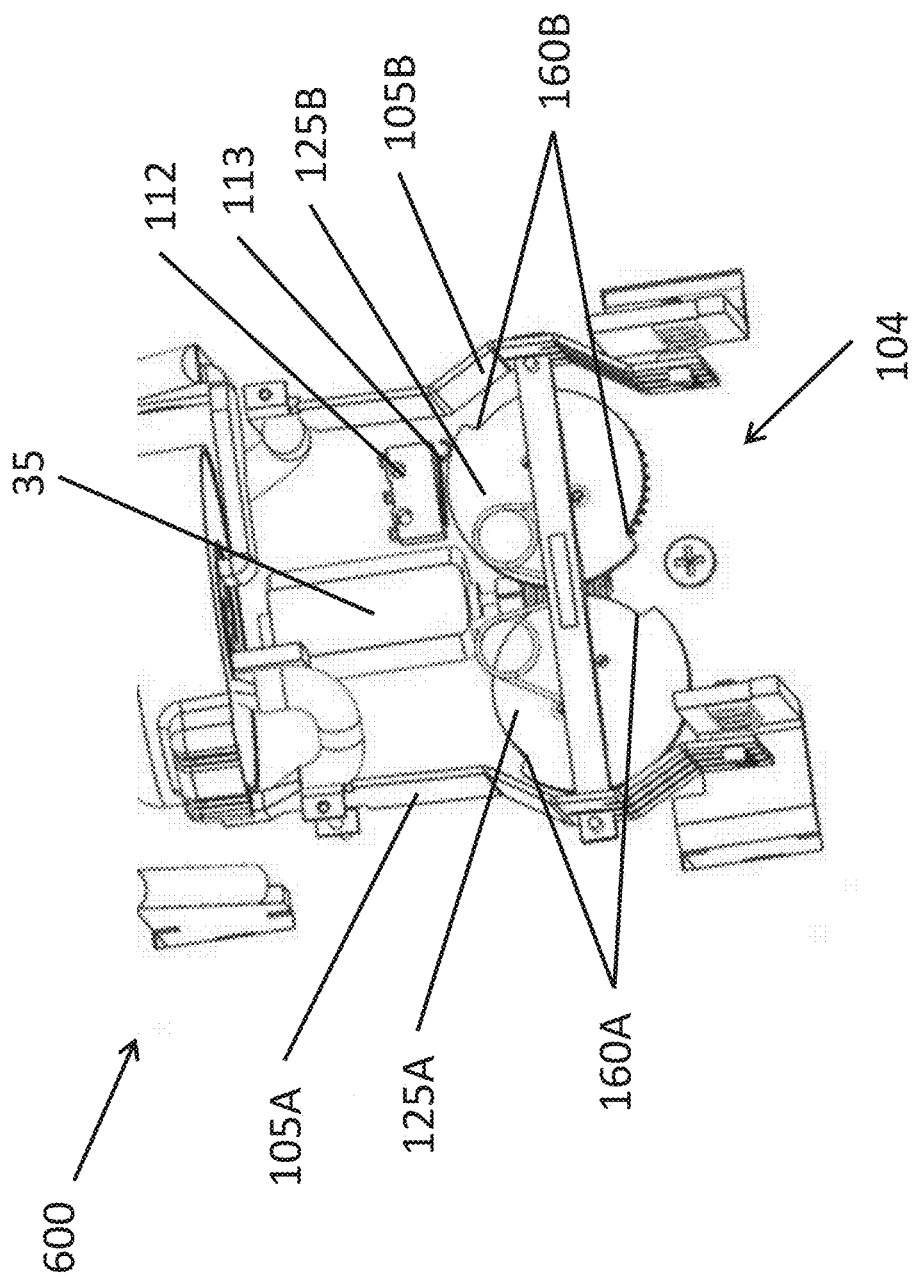
FIG. 6b is a perspective view of the meter shown in FIG. 6a with the switch in the open position.

FIGS. 6a and 6b illustrate an embodiment of an electrical energy meter 600 in which the position sensor 112 again is implemented by a microswitch. An extension arm 113 is coupled to the microswitch. The microswitch may be mounted to the electrical energy meter 600 and operably coupled to the disconnect switch 104. The disconnect switch 104 may comprise cams 125A,B and contact arms 105A,B. The cams 125A,B may include transition edges 106A,B, respectively. The extension arm 113 of the microswitch may be coupled to either cam 125A,B. As the motor 35 runs, causing the contact arms 105A,B to open or close, and the cams 125A,B to rotate, the extension arm 113 slides along the surface of the cam 125A,B to which it is coupled. The transition edge 160A,B indicates the change of position of the contact arms 105A,B, and therefore, whether the disconnect switch 104 is in the open or closed position. After the extension arm 113 slides over a transition edge 160A,B, the extension arm 113 may activate the microswitch. As illustrated in FIG. 6a, the meter disconnect switch 104 is in the closed position. After the cams 125A,B rotate, as shown in FIG. 6b, the disconnect switch 104 is in the open position. The activation of the microswitch by movement of the extension arm 113 thus provides an indication of the disconnect switch 104 position to the microprocessor 102.

Figure 7A:
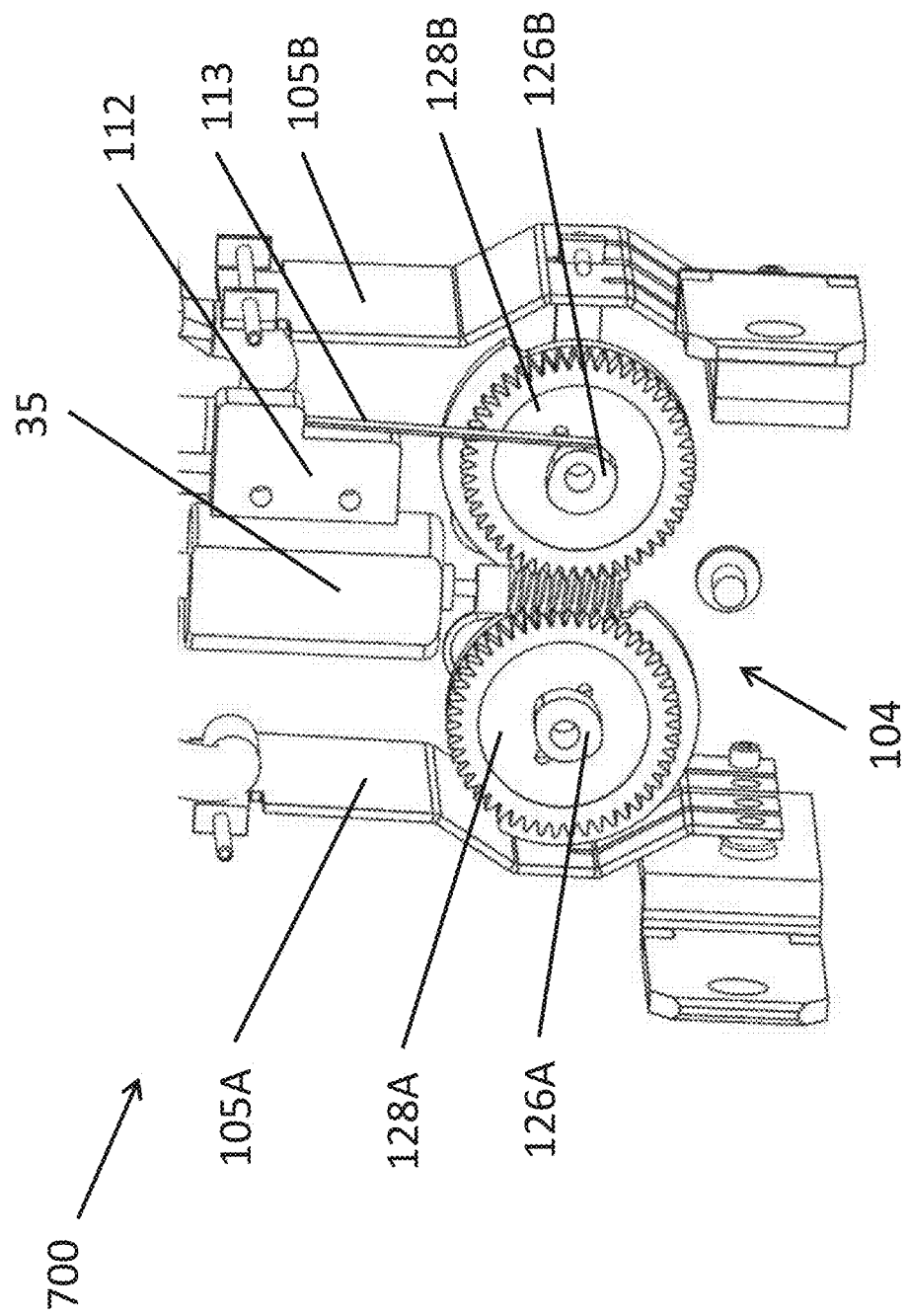
FIG. 7a is a perspective view of another exemplary embodiment of an electrical energy meter with a mounted microswitch and an eccentric cam with a switch in the closed position.
Figure 7B:
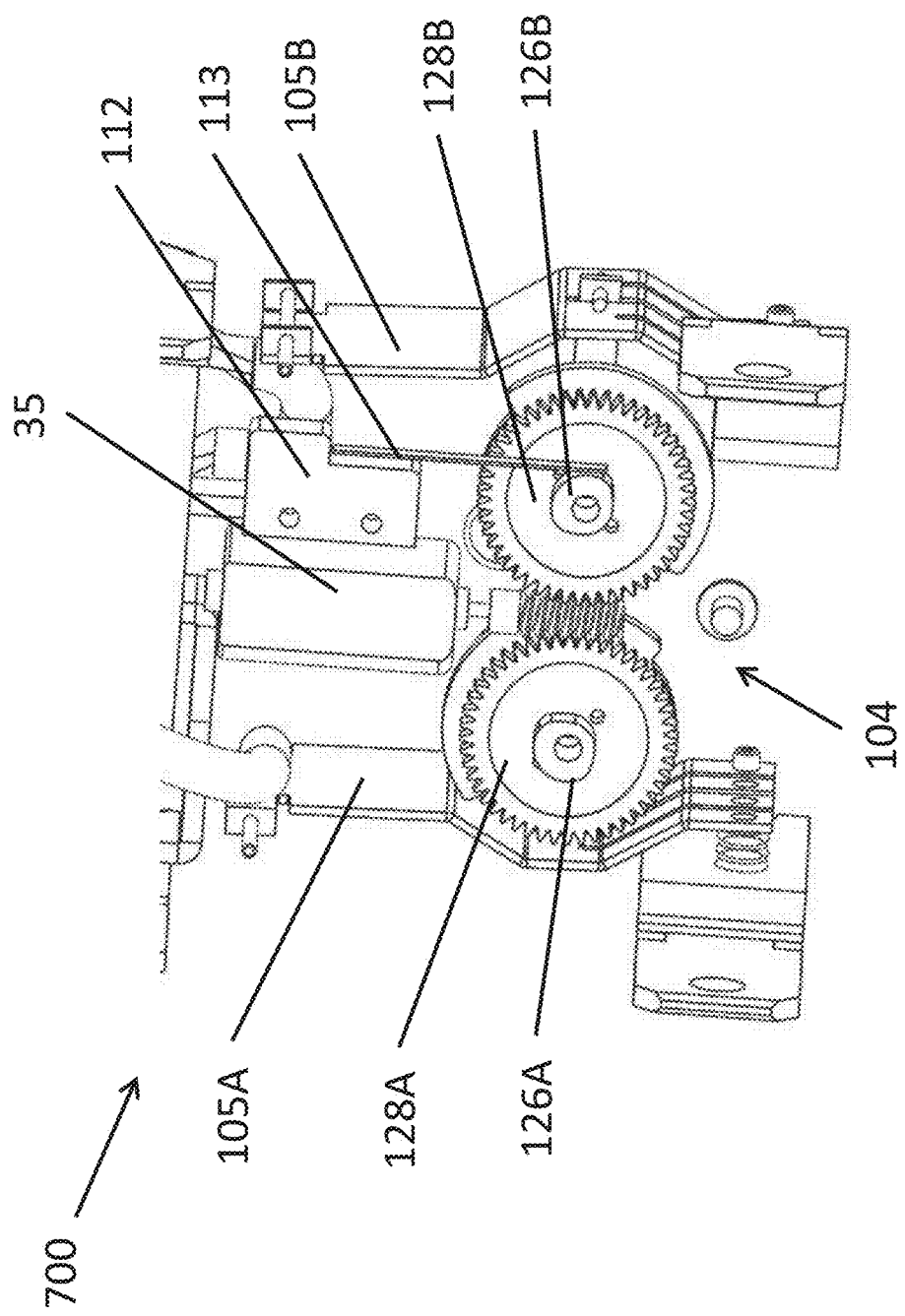
FIG. 7b is a perspective view of the meter shown in FIG. 7a with the switch in the open position.

Another embodiment of an electrical energy meter 700 with a position sensor is illustrated in FIGS. 7a and 7b. In this embodiment, the position sensor 112 again comprises a microswitch having an extension arm 113. The microswitch may be mounted on the electrical energy meter 700 and operably coupled to the disconnect switch 104. In this embodiment, the disconnect switch 104 comprises eccentric hubs 126A,B and gears 128A,B. The extension arm 113 may be coupled to either of the eccentric hubs 126A,B, which are connected to the gears 128A,B, respectively. In an embodiment, the eccentric hubs 126A,B may be molded into the gears 128A,B. The gears 128A,B are driven by motor 35. As the motor 35 runs and the gears 128A,B rotate, the extension arm 113 slides along the surface of the eccentric hub 126A,B to which it is coupled. The microswitch is activated by the motion of the extension arm 113 and thereby provides an indication of the disconnect switch 104 position to the microprocessor 102. FIGS. 7a and 7b show the disconnect switch 104 in the closed and open positions, respectively.

Figure 8:
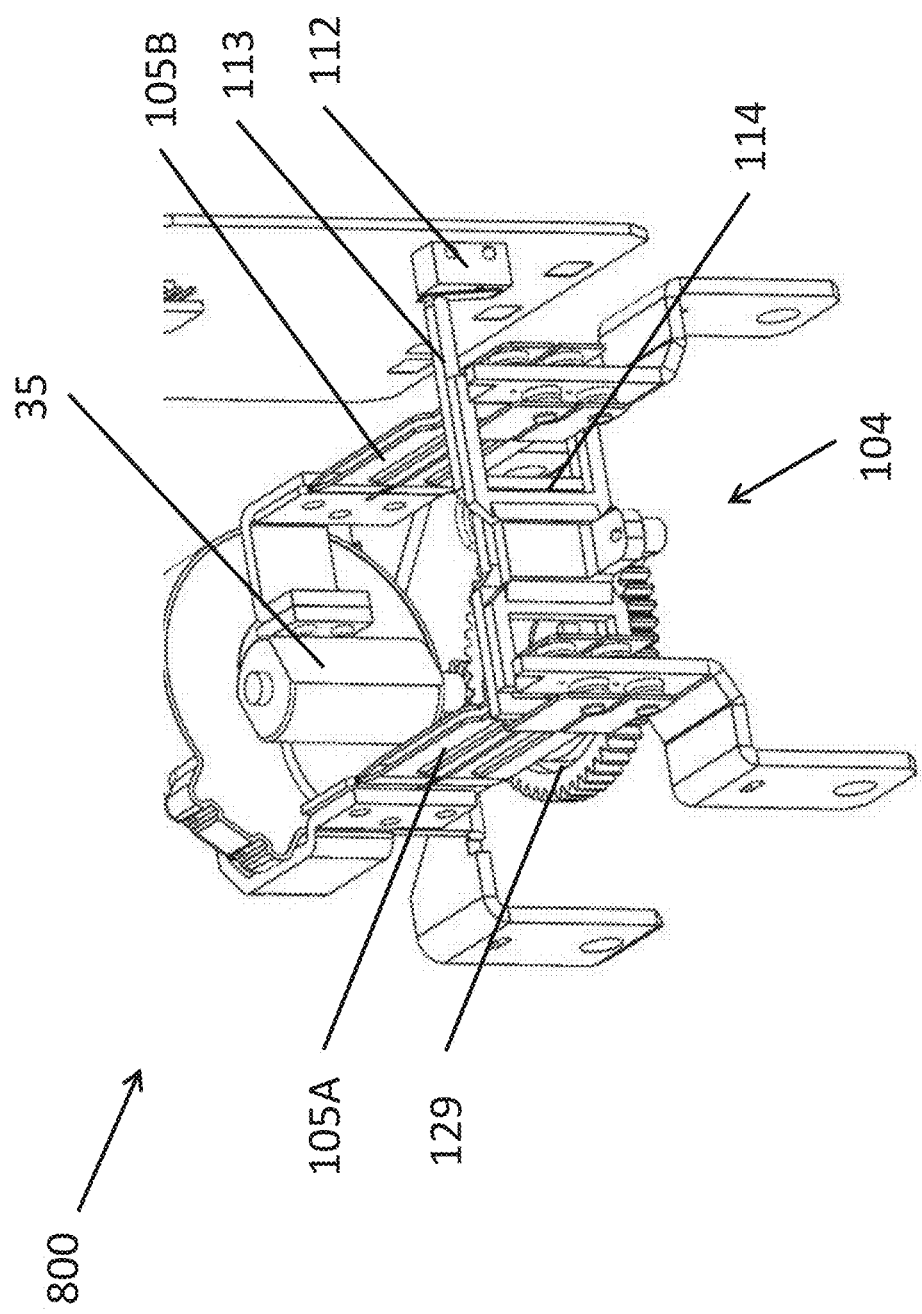
FIG. 8 is a perspective view of another exemplary embodiment of an electrical energy meter with a switch shuttle mechanism and an extension arm with a switch in the closed position.

Yet another embodiment of an electrical energy meter 800 having a position sensor is illustrated in FIG. 8. In this embodiment, the position sensor 112 comprises a microswitch having an extension arm 113 and a shuttle mechanism 114. The disconnect switch 104 comprises a driving gear 129, and the shuttle mechanism 114 is connected to the driving gear 129. The driving gear 129, which is driven by the motor 35, moves the shuttle mechanism 114, which in turn, moves the extension arm 113 that activates the microswitch. Activation of the microswitch thereby provides an indication of the disconnect switch 104 position to the microprocessor 102. FIG. 8 shows the disconnect switch 104 in the closed position. When the shuttle mechanism 114 moves the extension arm 113, the disconnect switch 104 is moved to the open position (not shown).

Figure 9A:
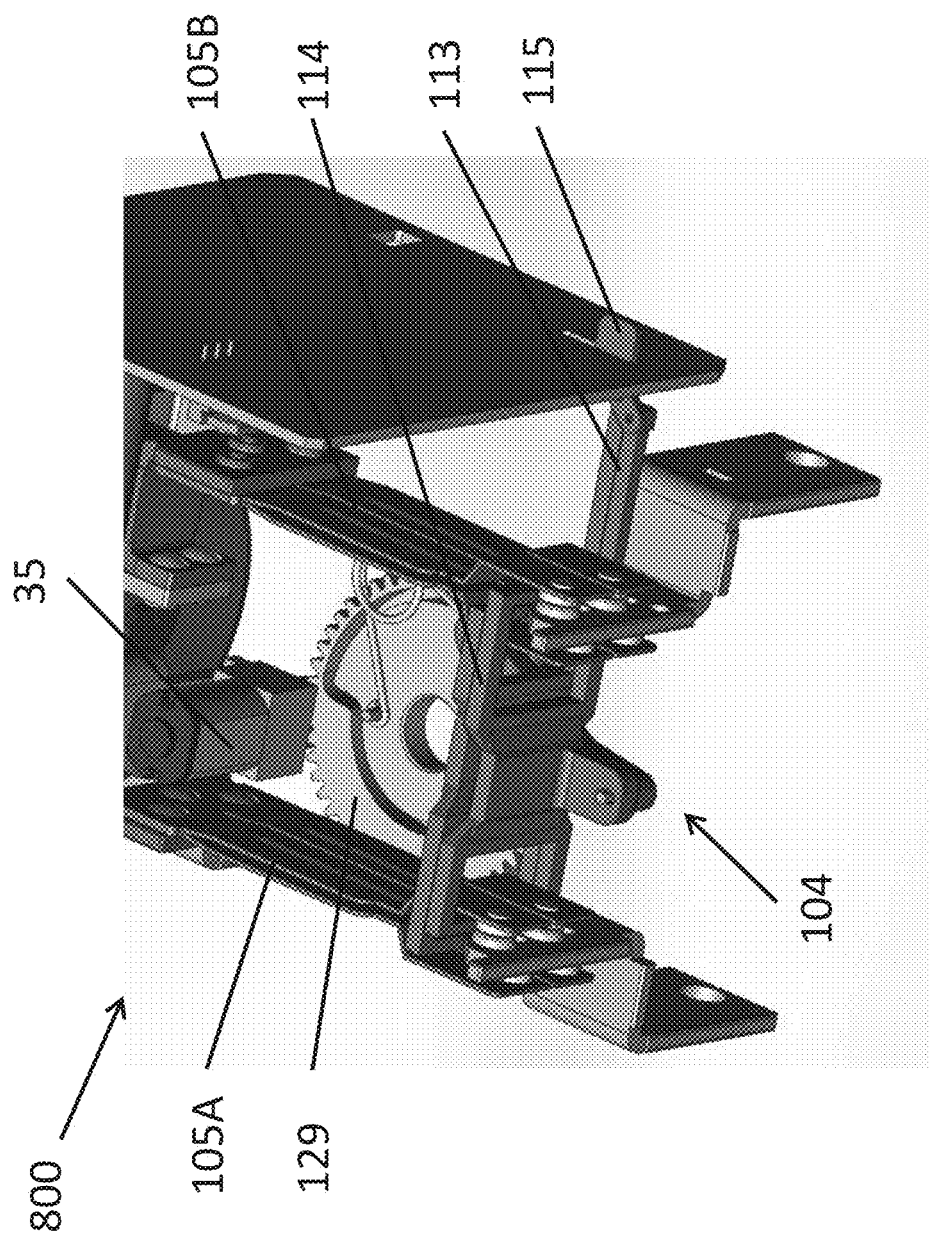
FIG. 9a is a perspective view of another exemplary embodiment of an electrical energy meter with a mechanical flag for interrupting a light beam with a switch in the open position.
Figure 9B:
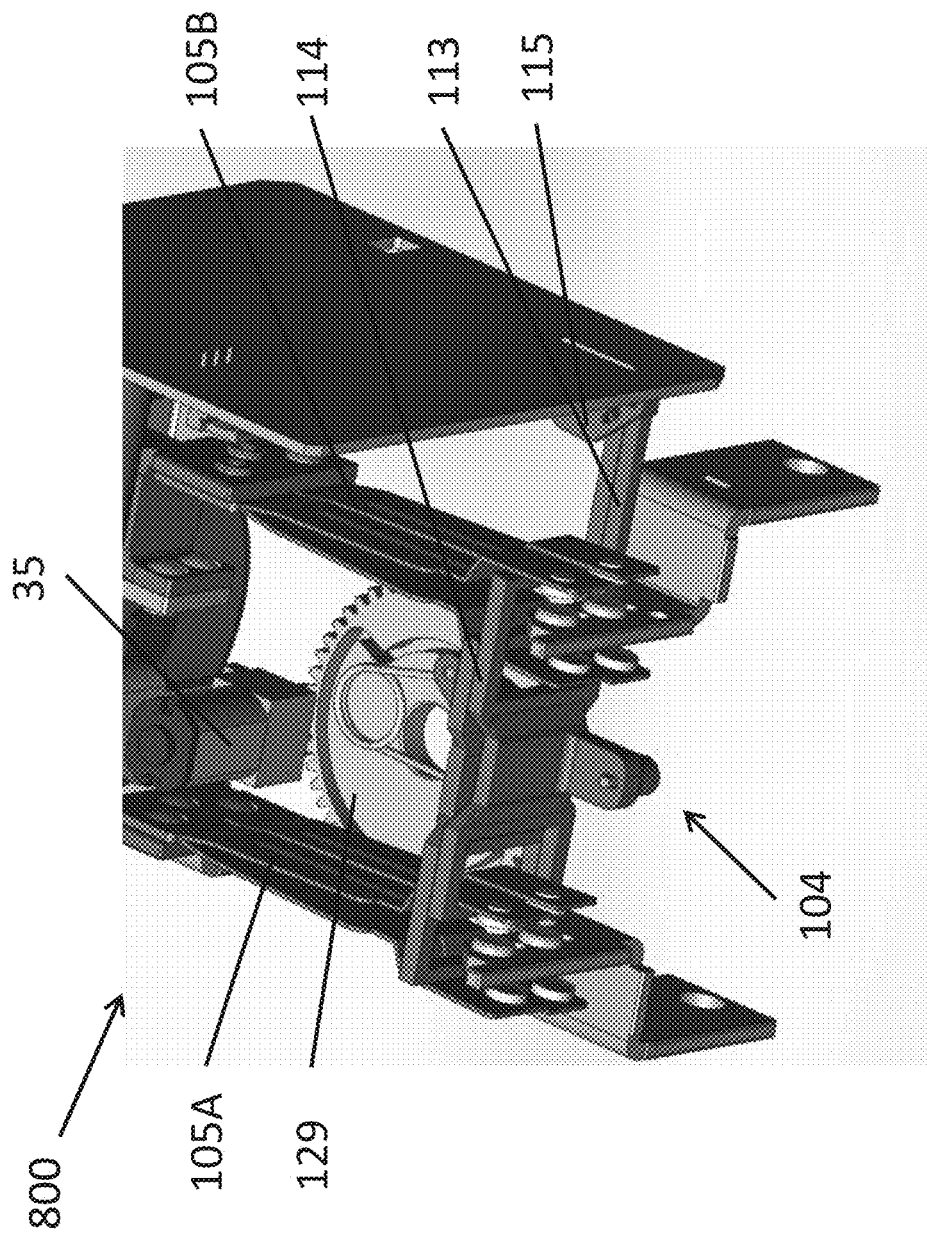
FIG. 9b is a perspective view of the meter shown in FIG. 9a with the switch in the closed position.

Another embodiment of an electrical energy meter 900 having a position sensor is illustrated in FIGS. 9a and 9b. In this embodiment, the position sensor 112 comprises an optical sensor (not shown) optically coupled to a mechanical flag 115. The mechanical flag 115 is connected to an extension arm 113 which is connected to a shuttle mechanism 114. The shuttle mechanism 114 is connected to a driving gear 129 of the disconnect switch 104. The driving gear 129, which is driven by the motor 35 and moves as the disconnect switch is opened and closed, in turn moves the shuttle mechanism 114, which in turn moves the extension arm 113 and the mechanical flag 115. The optical sensor may be activated by the position of the mechanical flag 115. That is, when the disconnect switch 104 is in one position, the mechanical flag 115 interrupts a light beam that would otherwise fall on the optical sensor. In the other position, the light beam is not interrupted. The optical sensor provides an electrical signal to the microprocessor 102 indicative of whether the light beam is interrupted or not. That signal is therefore indicative of the disconnect switch 104 position. FIGS. 9a and 9b show the disconnect switch 104 in the open and closed positions, respectively.

Figure 10:
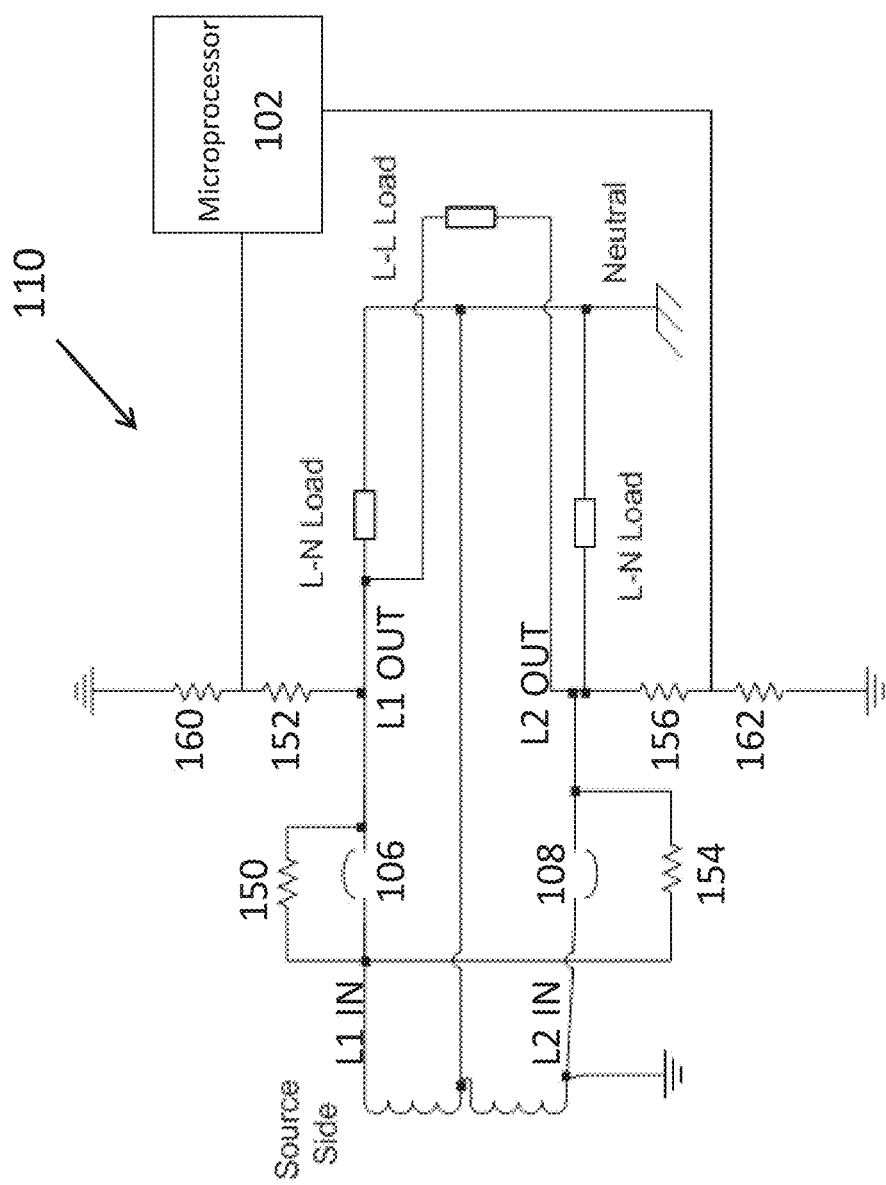
FIG. 10 is a schematic of one example embodiment of a load-side voltage sensor.

FIG. 10 is a schematic of one embodiment of a circuit for implementing the load-side voltage sensor 110 shown in FIGS. 2 and 3. As shown, a typical load will comprise both line-to-neutral (L-N Load) and line-to-line (L-L Load) components. In this embodiment, the load-side voltage sensor 110 comprises a pair of resistors 150,154 that connect to the source side at L1 IN and to the load side at L1 OUT and L2 OUT, as shown. Resistor 150 provides a leakage path around the L1 contacts, and resistor 154 provides a leakage path around the L2 contacts. The load-side voltage sensor 120 further comprises a first sensing resistor pair 152,160 and a second sensing resistor pair 156,162. Sensing resistor pair 152,160 is connected to the load side at L1 OUT and sensing resistor pair 156,162 is connected to the load side at L2 OUT. Each pair of sensing resistors forms a voltage divider that scales the respective L1 OUT/L2 OUT voltage to an acceptable level for input to (and sensing by) the microprocessor 102. It will be appreciated that any other suitable voltage sensing circuit arrangement may be employed, and the claims of the present application are not limited to the embodiment shown in FIG. 10.

While the disclosure is described herein using a limited number of embodiments, these specific embodiments are for illustrative purposes and are not intended to limit the scope of the disclosure as otherwise described and claimed herein. Modification and variations from the described embodiments exist. The scope of the invention is defined by the appended claims.

What is claimed:

1. An electrical energy meter for metering electrical energy delivered from a voltage source via feeder lines to an electrical load at a subscriber location, said meter disposed between said voltage source and said electrical load, the meter comprising:
- a disconnect switch, interposed into said feeder lines, for switching between an open position in which electrical energy is not supplied to said electrical load and a closed position in which electrical energy is supplied to said electrical load;
- a load-side voltage sensor, which provides voltage signals indicative of load-side voltage on a side of said disconnect switch connected to said electrical load;
- a position sensor operably coupled to the disconnect switch and providing an indication whether the disconnect switch is in the opened or closed position, wherein the position sensor is a microswitch; and
- a processor that receives the voltage signals from the load-side voltage sensor indicative of load-side voltage and the indication of the disconnect switch position from the position sensor and determines therefrom whether an abnormal condition exists.

2. The electrical energy meter of claim 1, wherein the disconnect switch comprises a cam that moves as the disconnect switch opens and closes, and wherein the microswitch is activated by the motion of and coupled to the cam.

3. The electrical energy meter of claim 1, wherein the disconnect switch comprises a cam having an eccentric hub that moves as the disconnect switch opens and closes, and wherein the microswitch is activated by the motion of and coupled to the eccentric hub.

4. The electrical energy meter of claim 1, wherein the disconnect switch comprises an extension arm that moves as the disconnect switch opens and closes, and wherein the microswitch is activated by motion of and coupled to the extension arm.

5. The electrical energy meter of claim 1, wherein the processor samples the voltage signal from the load side voltage sensor within 1 second of a meter disconnect operation.

6. The electrical energy meter of claim 1, wherein the processor determines that an abnormal condition exists when the load-side voltage sensor indicates a load-side voltage is present and the position sensor indicates the disconnect switch is in the open position.

7. The electrical energy meter of claim 1, wherein the processor determines that an abnormal condition exists when the load-side voltage sensor indicates there is no load-side voltage and the position sensor indicates the disconnect switch is in the closed position.

8. The electrical energy meter of claim 1, wherein the processor is configured to retain an indication of whether the disconnect switch should be in an opened or a closed position, wherein the processor determines whether an abnormal condition exists based on the signal indicative of load-side voltage, the indication of whether the disconnect switch is in an open or a closed position, and the retained indication of whether the disconnect switch should be in an opened or closed position.

9. An electrical energy meter for metering electrical energy delivered from a voltage source via feeder lines to an electrical load at a subscriber location, said meter disposed between said voltage source and said electrical load, the meter comprising:
- a disconnect switch, interposed into said feeder lines, for switching between an open position in which electrical energy is not supplied to said electrical load and a closed position in which electrical energy is supplied to said electrical load;
- a load-side voltage sensor, which provides voltage signals indicative of load-side voltage on a side of said disconnect switch connected to said electrical load;
- a position sensor operably coupled to the disconnect switch and providing an indication whether the disconnect switch is in the opened or closed position, wherein the position sensor is an optical sensor and wherein the disconnect switch comprises a mechanical flag that moves as the disconnect switch opens and closes, and wherein the motion of the mechanical flag interrupts a light beam, the interruption of the light beam being detected by the optical sensor; and,
- a processor that receives the voltage signals from the load-side voltage sensor indicative of load-side voltage and the indication of the disconnect switch position from the position sensor and determines therefrom whether an abnormal condition exists.

10. A method for detecting an abnormal condition in an electrical energy meter, said meter metering electrical energy delivered from a voltage source via feeder lines to an electrical load at a subscriber location, said meter having a disconnect switch disposed between said voltage source and said electrical load, the method comprising:
- receiving a signal indicative of a load-side voltage on a side of the disconnect switch connected to said electrical load;
- receiving an indication of whether the disconnect switch is in an open or a closed position; and
- determining whether an abnormal condition exists based on the signal indicative of load-side voltage and the indication of whether the disconnect switch is in an open or a closed position,
- wherein the method further comprises activating a microswitch during a meter disconnect operation to indicate whether the disconnect switch is in an open or a closed position, said microswitch being operably coupled to the electrical energy meter.

11. The method of claim 10, wherein receiving the signal indicative of the load-side voltage further comprises receiving the signal within 1 second of a meter disconnect operation.

12. The method of claim 10, wherein an abnormal condition is determined when the signal indicative of load-side voltage indicates a load-side voltage is present and the indication of whether the disconnect switch is in an open or a closed position indicates the disconnect switch is in the open position.

13. The method of claim 10, wherein an abnormal condition is determined when the signal indicative of load-side voltage indicates a load-side voltage is not present and the indication of whether the disconnect switch is in an open or a closed position indicates the disconnect switch is in the closed position.

14. The method of claim 10, further comprising retaining an indication of whether the disconnect switch should be in an opened or a closed position, wherein determining whether an abnormal condition exists is further based on the indication of whether the disconnect switch should be in an opened or a closed position.

* * * * *